(12) United States Patent
Kim

(10) Patent No.: US 7,593,280 B2
(45) Date of Patent: Sep. 22, 2009

(54) SEMICONDUCTOR MEMORY DEVICE OPERATING WITH A LOWER VOLTAGE FOR PERIPHERAL AREA IN POWER SAVING MODE

(75) Inventor: Kwang-Hyun Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 323 days.

(21) Appl. No.: 11/714,155

(22) Filed: Mar. 6, 2007

(65) Prior Publication Data
US 2008/0002485 A1    Jan. 3, 2008

(30) Foreign Application Priority Data
Jun. 29, 2006 (KR) .................. 10-2006-0059260

(51) Int. Cl.
*G11C 7/00* (2006.01)
(52) U.S. Cl. .................. 365/222; 365/228; 365/229
(58) Field of Classification Search ............ 365/189.17, 365/189.05, 189.09, 222, 226, 227, 228, 365/229
See application file for complete search history.

(56) References Cited

U.S. PATENT DOCUMENTS

| | | | |
|---|---|---|---|
| 6,005,436 A * | 12/1999 | Shibayama et al. ......... | 327/546 |
| 6,349,068 B2 | 2/2002 | Takemae et al. | |
| 6,442,095 B1 * | 8/2002 | Ooishi ........................ | 365/229 |
| 6,518,595 B2 | 2/2003 | Lee | |
| 6,795,362 B2 | 9/2004 | Nakai et al. | |
| 6,868,029 B2 * | 3/2005 | Ooishi et al. ................ | 365/229 |
| 6,922,369 B2 | 7/2005 | Kim | |
| 7,082,073 B2 | 7/2006 | Casper | |
| 7,251,170 B2 * | 7/2007 | Lee et al. ............... | 365/189.09 |
| 7,492,654 B2 * | 2/2009 | Won et al. .................... | 365/205 |
| 2004/0125680 A1 | 7/2004 | Kim | |

FOREIGN PATENT DOCUMENTS

| | | |
|---|---|---|
| JP | 2000-149557 | 5/2000 |
| JP | 2001-052476 | 2/2001 |
| JP | 2003-68076 A | 3/2003 |
| KR | 1998-065675 | 10/1998 |
| KR | 10-2001-0057487 A | 7/2001 |
| KR | 10-2004-0011835 A | 2/2004 |

OTHER PUBLICATIONS

Korean Office Action issued in corresponding Korean Patent Application No. KR 10-2006-0059260, issued on Oct. 31, 2007.

* cited by examiner

*Primary Examiner*—VanThu Nguyen
(74) *Attorney, Agent, or Firm*—Mannava & Kang, P.C.

(57) ABSTRACT

A semiconductor memory device reduces power consumption during a refresh operation. The semiconductor memory device comprises a voltage generator, a sensing controller, an output driver and a data transmitter. The voltage generator is configured to generate an internal power voltage, which is lower during a power saving mode than during a normal mode, for a peripheral area. The sensing controller is configured to generate a control signal corresponding to a level of the internal power voltage. The output driver is configured to drive a transmitting data by using an output voltage. The data transmitter is configured to convert an inputting data into the transmitting data by using the internal power voltage or convert the inputting data into the transmitting data by using the output voltage in response to the control signal.

36 Claims, 6 Drawing Sheets

SEMICONDUCTOR MEMORY DEVICE OPERATING WITH A LOWER VOLTAGE FOR PERIPHERAL AREA IN POWER SAVING MODE

CROSS-REFERENCE TO RELATED APPLICATIONS

The present invention claims priority of Korean patent application number 10-2006-0059260, filed in the Korean Patent Office on Jun. 29, 2006, which is incorporated by reference in its entirety.

BACKGROUND OF THE INVENTION

The present invention relates to a semiconductor memory device; more particularly, to a circuit for an internal power voltage of the semiconductor memory device.

The semiconductor memory device includes a data storage area, a peripheral area and an I/O area. The data storage area is provided with a plurality of unit cells, each storing one data. The peripheral area is provided with circuits for efficiently accessing data stored in the unit cells. For example, there is a sense amplifier for sensing and amplifying data from a unit cell. There are also transmitting circuits for reading or writing operations. A transmitting circuit for a reading operation transmits data from a unit cell to an I/O pad in order to output the data to an external device. A transmitting circuit for a writing operation transmits data from an I/O pad to a unit cell to thereby input the data to inside of the semiconductor memory device. The I/O area is provided with a data I/O circuit and an address input circuit. The data I/O circuit is used for performing data input and output between the semiconductor memory device and an external device. The address input circuit transmits addresses input from the exterior to the peripheral area. In particular, the data I/O circuit is provided with a data output driver having higher driving ability than other internal circuits so as to efficiently output the data. The driving ability refers to an ability to generate a voltage stably.

A Dynamic Random Access Memory (DRAM), in general, has a unit cell provided with a MOS transistor and a capacitor. In order to store more data in a given area, the MOS transistor is designed smaller. Meanwhile, MOS transistors constituting the circuits in the peripheral area are designed for transmitting data faster. Accordingly, for efficient operation, different levels of internal power voltages are supplied to the data storage area and the peripheral area. Generally, the internal power voltage supplied to the data storage area is called a core voltage.

A semiconductor memory device such as a DRAM uses a capacitor for data storage. It is required that the data stored in the capacitor be refreshed regularly. Over time, the capacitor loses a charge corresponding to the data. Before the charge stored in the capacitor of the unit cell falls below predetermined amount, the semiconductor memory device operates to compensate for the lost amount of charge. This process is called a refresh operation.

The refresh operation supplies a charge to each capacitor constituting each unit cell included in the data storage area so as to thereby maintain the original charge corresponding to the original data before the loss of charge. Circuits related to data input or output in the peripheral area do not perform any actual operation during the refresh operation. Accordingly, the semiconductor memory device reduces the level of an internal power voltage for circuits irrelevant to the refresh operation, in order to decrease power consumption during the period of the refresh operation.

During normal operation when the data input or output is performed, the semiconductor memory device provides an external supply voltage to internal circuits, relevant to data input/output, in the peripheral area. Meanwhile, during the refresh operation, the semiconductor memory device provides a core voltage lower than the supply voltage to the above internal circuits. The core voltage provided to the data storage area is lower than an internal power voltage generally provided to the peripheral area. The internal power voltage for the peripheral area is generated based on the external supply voltage. That is, during the refresh operation, the semiconductor memory device provides a part of the peripheral area with the core voltage instead of the internal power voltage for the normal operation, in order to decrease power consumption.

The semiconductor memory device supplies the external supply voltage as an internal power voltage to circuits in the I/O area. Because a part of peripheral area is provided with the core voltage lower than the supply voltage during the refresh operation, malfunction can be caused in links between the peripheral and the I/O areas. Among the part of the peripheral area, data transmitting circuits are not related to the refresh operation and are connected to the I/O area. Due to a voltage difference between the data transmitting circuits and the I/O area, a leakage current can be caused. The core voltage having a lower voltage level than the supply voltage is provided to the data transmitting circuits in the refresh operation, in order to decrease the power consumption. However, this can cause other unnecessary power consumption by making current leak out.

SUMMARY OF THE INVENTION

Embodiments of the present invention are directed to provide a semiconductor memory device with reduced power consumption during a period of refresh operation.

In accordance with an aspect of the present invention, the semiconductor memory device comprises; a voltage generator configured to generate an internal power voltage, which is lower during a power saving mode than during a normal mode, for a peripheral area; a sensing controller configured to generate a control signal corresponding to a level of the internal power voltage; an output driver configured to drive a transmitting data by using an output voltage; and a data transmitter configured to convert an inputting data into the transmitting data by using the internal power voltage or convert the inputting data into the transmitting data by using the output voltage in response to the control signal.

In accordance with an another aspect of the present invention, the semiconductor memory device comprises; a voltage generator for outputting an internal power voltage for a peripheral area at a first voltage level during a normal operation and at a second voltage level, lower than the first voltage level, during a refresh operation; a voltage sensor for sensing the level of the internal power voltage; a selecting signal generator for outputting a selecting signal according to sensing results of the voltage sensor; a data transmitter for converting an inputting data into an transmitting data by using the internal power voltage or an output voltage in response to the selecting signal; and an output driver for driving the transmitting data by the output voltage, wherein the output voltage is in the first voltage level.

In accordance with an further aspect of the present invention, the semiconductor memory device receiving one of a first supply voltage and a second supply voltage, higher than the first supply voltage, comprises; a voltage generator for outputting an internal power voltage for a peripheral area at a first voltage level in normal operation and at a second voltage level, lower than the first voltage level, in a power saving mode by using the supply voltage; a sensing controller for outputting a control signal corresponding to the level of the internal power voltage; a first data transmitter for transmitting inputting data by using the internal power voltage at the first supply voltage; a second data transmitter for transmitting the inputting data by using the supply voltage at the second supply voltage; a selecting controller for selectively enabling one of the first and the second data transmitters according to the control signal; and an output driver for driving data transmitted from the data transmitters by using the supply voltage.

In further embodiment, a method for driving the semiconductor memory device comprises; generating a internal power voltage for a peripheral area at a first voltage level; decreasing the internal power voltage from the first voltage level to a second voltage level in a power saving mode; sensing the level of the internal power voltage; outputting a control signal in response to the sensing results; latching data output from a core area by using the first voltage level of the internal power voltage or the second voltage level of the internal power voltage in response to the control signal; and driving an output driver in response to the latched data.

DESCRIPTION OF SPECIFIC EMBODIMENTS

In a self refresh operation, a semiconductor memory device decreases the level of an internal power voltage supplied to circuits in a peripheral area, thereby to reduce power consumption. While the power consumption is reduced, a leakage current in an output driver of an I/O area can be also prevented. Accordingly the power consumption can be efficiently reduced.

Hereinafter, a semiconductor memory device in accordance with the present invention will be described in detail referring to the accompanying drawings.

Figure 1:
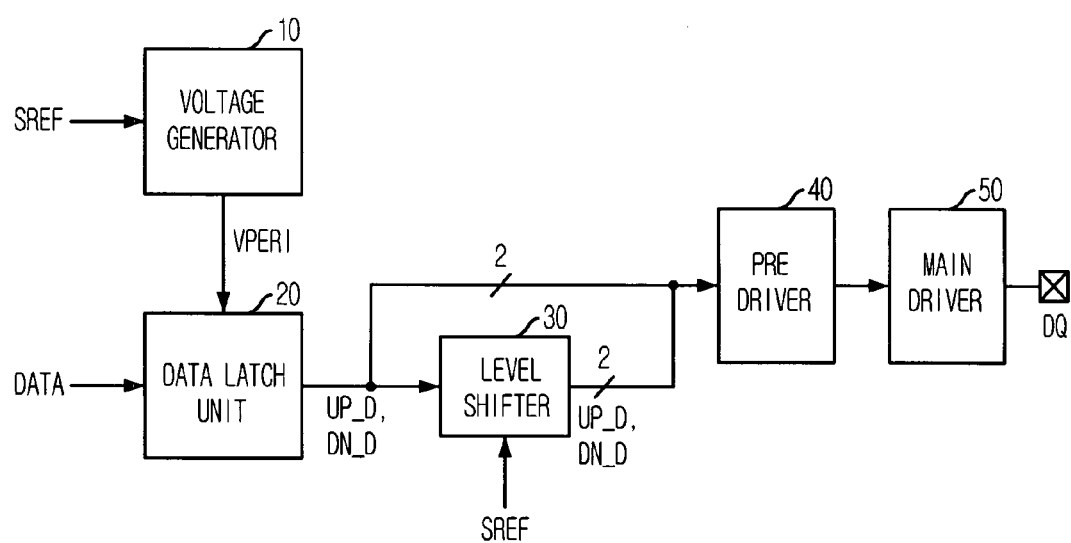
FIG. 1 is a block diagram of a semiconductor memory device in accordance with the present invention.

FIG. 1 is a block diagram of the semiconductor memory device in accordance with the present invention. The semiconductor memory device includes a voltage generator 10, a data transmitter, a pre driver 40 and a main driver 50.

The voltage generator 10 generates an internal power voltage VPERI for the peripheral area. The voltage generator 10 decreases the internal power voltage VPERI in response to a refresh signal SREF, which is activated during a self refresh operation.

The data transmitter includes a data latch unit 20 and level shifter 30. The data latch unit 20 receives a data DATA from the data storage area and latches the data DATA with the internal power voltage VPERI. The level shifter 30 shifts the level of latched data UP_D and DN_D in response to the refresh signal SREF.

The pre driver 40 receives the latched data UP_D and DN_D and outputs a pre driving signal. The main driver 50 drives data I/O pad DQ in response to the pre driving signal. The pre driver 40 and the main driver 50 constitute an output driver for data output.

Figure 2:
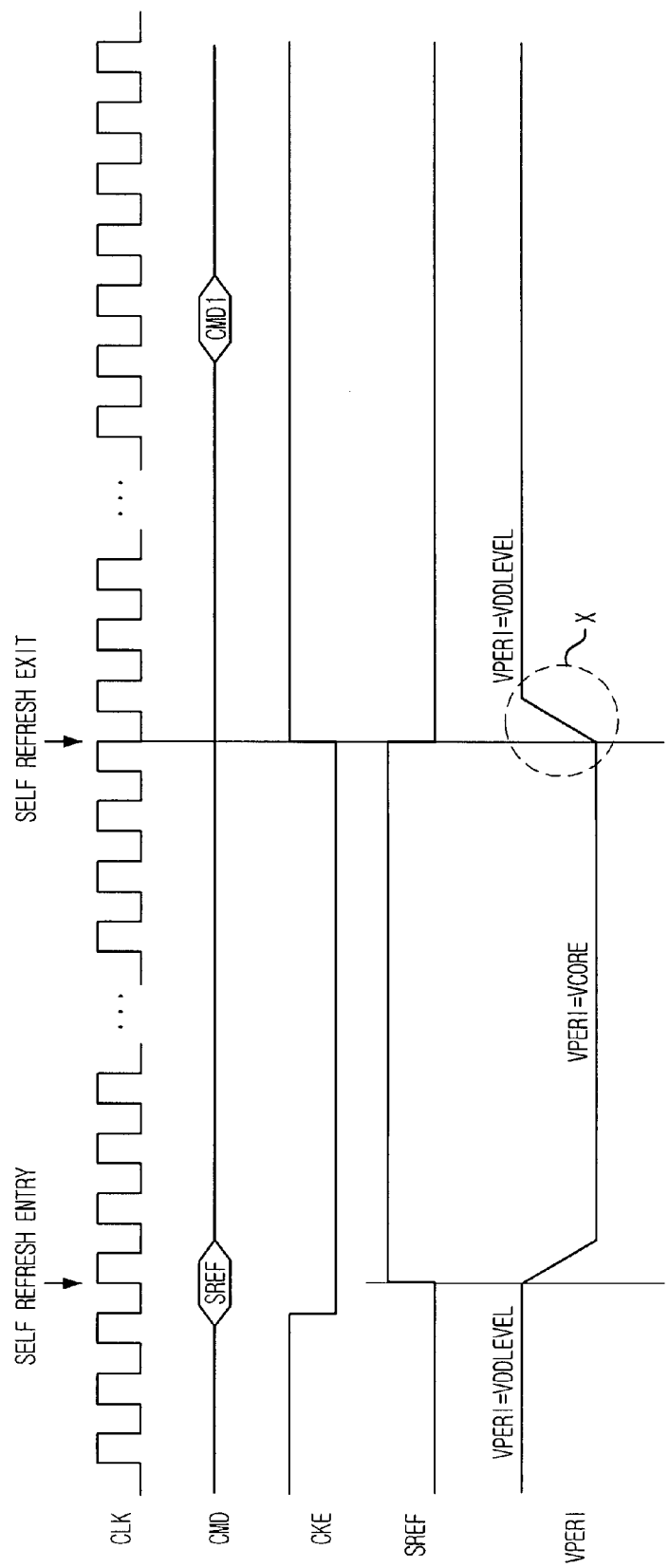
FIG. 2 is a signal timing diagram of the semiconductor memory device shown in FIG. 1.

FIG. 2 is a signal timing diagram of the semiconductor memory device shown in FIG. 1.

When a clock enabling signal CKE is inactivated to a low logic state and a self refresh command is input, the semiconductor memory device activates the refresh signal SREF internally. Because there is no input and output data during the self refresh operation, the voltage generator 10 decreases the internal power voltage VPERI to a predetermined level. Therefore, power consumption on a data output route is reduced. Instead of generating an additional voltage, the core voltage VCORE, i.e., an internal power voltage for the data storage area, is used. The core voltage VCORE is lower than the internal power voltage VDDLEVEL for the peripheral area by a predetermined level. The internal power voltage VDDLEVEL has the same level as the supply voltage VDD input from the exterior.

Meanwhile the pre driver 40 and the main driver 50 are disposed in the I/O area for outputting the data. The pre driver 40 and the main driver 50 are operated by the supply voltage VDD. Because the data latch unit 20 receives the reduced internal power voltage as low as the core voltage VCORE, unintended leakage current path can be caused wherein the data latch unit 20 is connected to the pre driver 40. An output buffer in the data latch unit 20 generates signals having the same level with the core voltage VCORE. Plural MOS transistors which form an input buffer in the pre driver 40 are operated with the supply voltage VDD and the ground voltage VSS. Because the MOS transistors receive signals at the level of the core voltage VCORE through gates, the MOS transistors are not fully turned on, but only partially turned on. During the self refresh operation, a leakage current path can be caused in the input buffer of the pre driver 40.

The level shifter 30 constitutes the data transmitter to prevent the leakage current path. The level shifter 30 increases the level of outputs from the data latch unit 20 up to the level of the supply voltage VDD to thereby output to the pre driver 40 during the self refresh operation. Because the internal power voltage VPERI for the data transmitter decreases during a self refresh operation, power consumption is reduced. The undesired current path causing the leakage current is also prevented by the level shifter 30.

However, plural level shifters can impose new design pressures. A level shifter is required for each of the plurality of data I/O pads. The level shifters occupy a good deal of circuit area.

In addition, at the end in the self refresh operation, it takes a period of time for the decreased internal power voltage to recover to its original level, as depicted at label X in FIG. 2. However, it is a relatively short time that the level shifter is disabled. Therefore, a leakage current path can be caused until the decreased internal power voltage recovers to its original level. Thus, use of the level shifter introduces a difficult to remove leakage current at the end of a self refresh operation.

Figure 3:
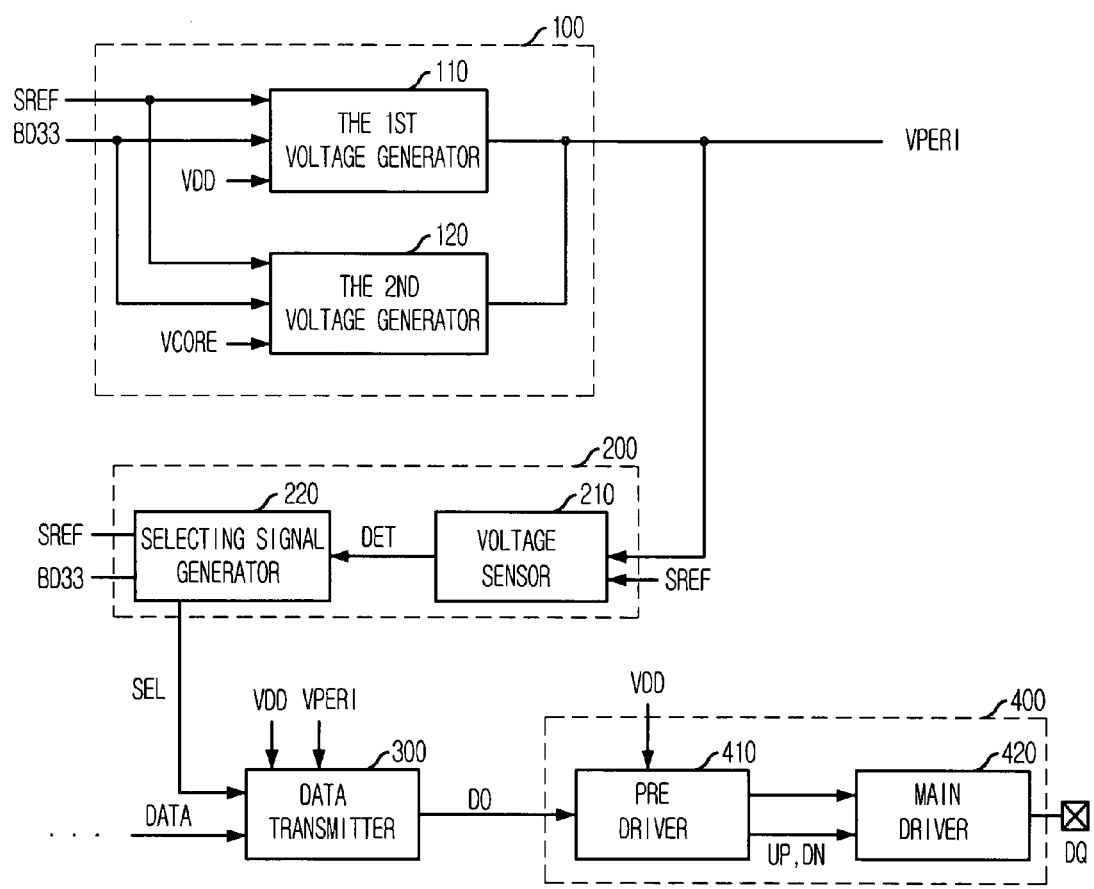
FIG. 3 is a block diagram of a semiconductor memory device in accordance with another embodiment of the present invention.

FIG. 3 is a block diagram of a semiconductor memory device in accordance with another embodiment of the present invention. The semiconductor memory device includes a voltage generator 100, a voltage sensor 210, a selecting signal generator 220, a data transmitter 300 and an output driver 400.

The voltage generator 100 generates an internal power voltage VPERI for the peripheral area, wherein VPERI has a lower level than a predetermined level during a power saving mode such as the self refresh period. The power saving mode could be other periods according to circumstances, including various kinds of modes for power reduction.

The voltage generator 100 includes first and second voltage generators 110 and 120. The first voltage generator 110 outputs an internal power voltage VPERI at the predetermined level VDD. The second voltage generator 120 outputs the internal power voltage VPERI at the core voltage level VCORE, which is lower than the predetermined level VDD. When the refresh signal SREF is active in a self refresh operation, the first voltage generator 110 is disabled and the second voltage generator 120 is enabled. When the refresh signal SREF is inactive, the first voltage generator 110 is enabled and the second voltage generator 120 is disabled.

The voltage sensor 210 senses the level of the internal power voltage VPERI output from the voltage generator 100. The selecting signal generator 220 outputs a selecting signal SEL to the data transmitter 300 according to sensing result of the voltage sensor 210.

In response to the selecting signal SEL, the data transmitter 300 converts a data DATA into a transmitting data DO either by using the supply voltage VDD or the internal power voltage VPERI.

The output driver 400 transfers the transmitting data DO by using an output voltage. The output driver 400 includes a pre driver 410 and a main driver 420. The pre driver 410 buffers the transmitting data by using the output voltage. The main driver 420 drives buffered data through a data I/O pad DQ. The supply voltage VDD is used as the output voltage.

Figure 4:
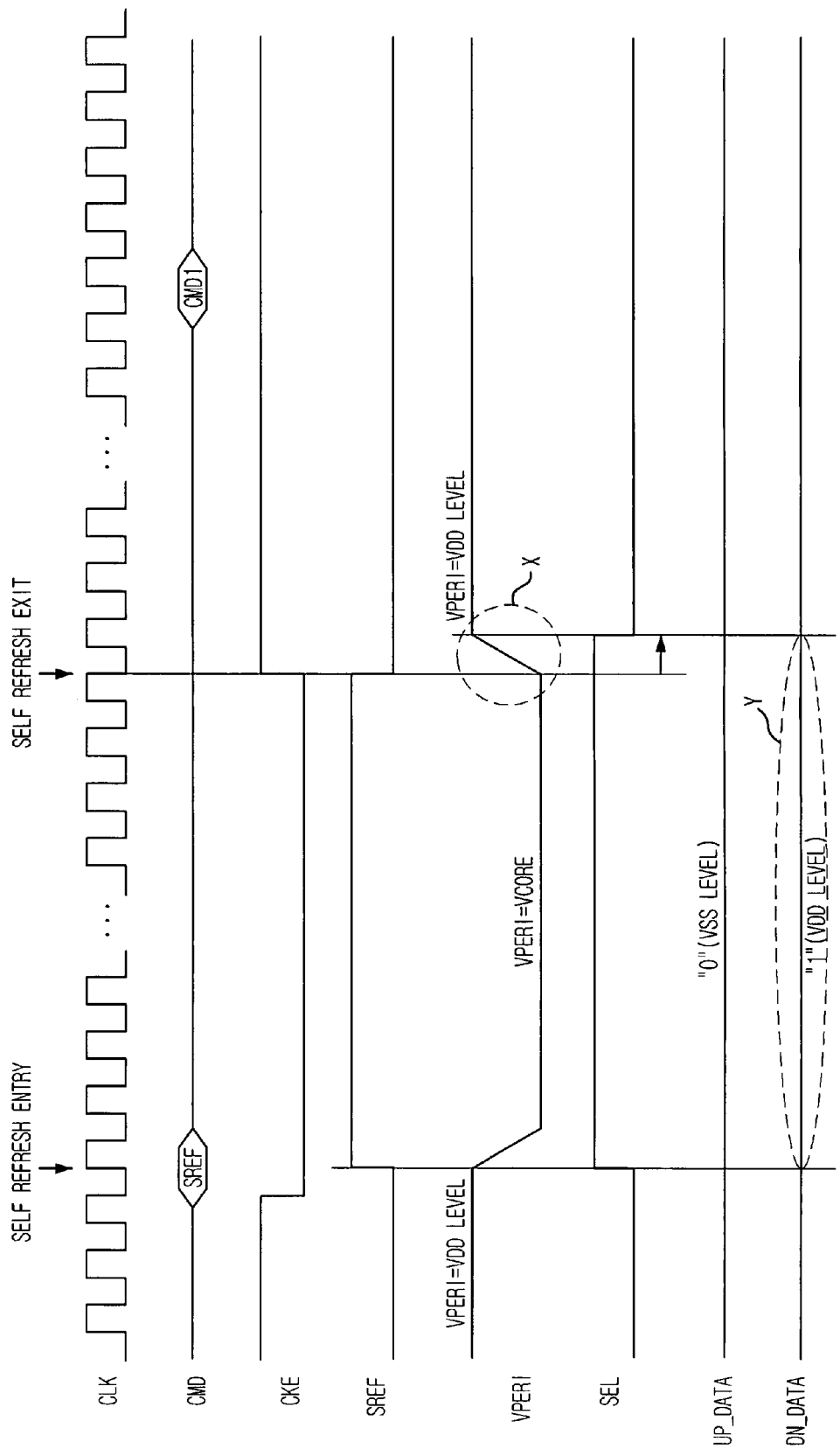
FIG. 4 is a signal timing diagram of the semiconductor memory device shown in FIG. 3.

FIG. 4 is a signal timing diagram of the semiconductor memory device shown in FIG. 3. In the self refresh operation, the clock enabling signal CKE is disabled and the self refresh signal SREF is activated to a high logic state. The level of the internal power voltage VPERI temporarily decreases from the level of the supply voltage VDD to that of the core voltage VCORE. At the end of the self refresh operation, the clock enabling signal CKE is enabled. The self refresh signal is inactivated to a low logic state. The level of the internal power voltage VPERI recovers from the level of the core voltage VCORE up to that of the supply voltage VDD.

Figure 5:
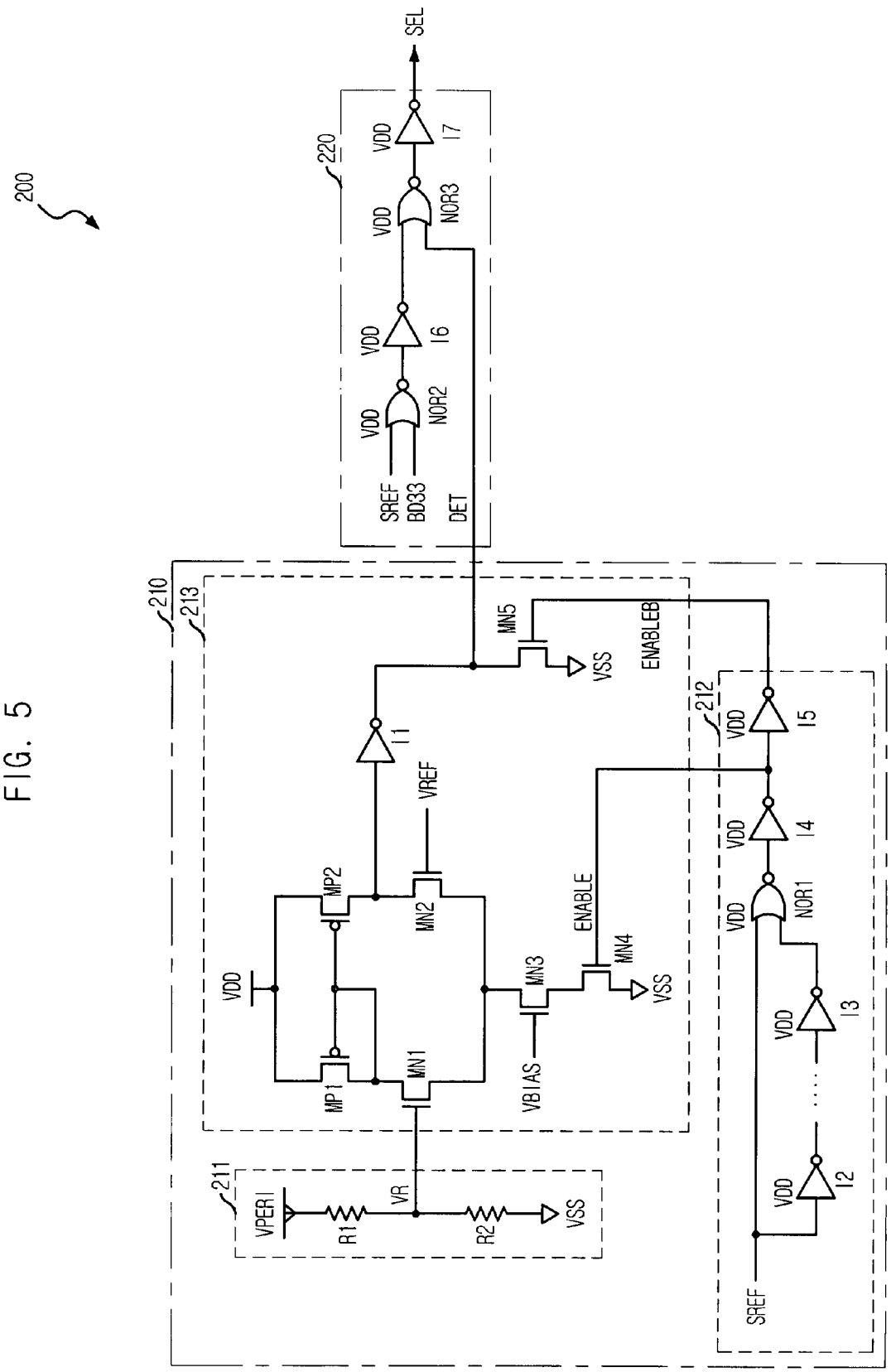
FIG. 5 is a schematic circuit diagram of a voltage sensor and a selecting signal generator shown in FIG. 3.

FIG. 5 is a schematic circuit diagram of the voltage sensor and the selecting signal generator shown in FIG. 3. The voltage sensor 210 includes an enabling signal generator 212, a comparing voltage generator 211, and a comparator 213. The enabling signal generator 212 outputs enabling signals ENABLE and ENABLEB in response to the refresh signal SREF. The comparing voltage generator 211 outputs a comparing voltage VR which may be set to some level in the range from the ground voltage VSS to the internal power voltage VPERI. The comparator 213 compares the comparing voltage VR and a reference voltage VREF to thereby output a detecting signal DET.

The enabling signal generator 212 includes a plurality of inverters in series, a NOR gate NOR1 and two inverters I4 and I5. The NOR gate NOR1 receives an output of the plurality of inverters and the refresh signal SREF. The first inverter I4 inverts an output of the NOR gate NOR1 and outputs the first enabling signal ENABLE. The second inverter I5 inverts an output of the first inverter I4 and outputs the second enabling signal ENABLEB. The comparing voltage generator 211 includes two resistors R1 and R2 coupled in series between the internal power voltage VPERI and the ground voltage VSS.

The comparator 213 includes an inverter I1 and a plurality of PMOS and NMOS transistors. First and second PMOS transistors MP1 and MP2 are coupled to the supply voltage VDD so as to form a current mirror. A first NMOS transistor MN1 is coupled to the first PMOS transistor MP1 and receives the comparing voltage VR through a gate. A second NMOS transistor MN2 is coupled to the second PMOS transistor MP2 and receives the reference voltage VREF through a gate. The other sides of the first and the second NMOS transistors MN1 and MN2 are coupled to a third NMOS transistor MN3, which receives a bias voltage VBIAS through its gate. A fourth NMOS transistor MN4 is connected between the third NMOS transistor MN3 and the ground voltage VSS, and receives the first enabling signal ENABLE through a gate. The inverter I1 outputs the detecting signal DET. A fifth NMOS transistor MN5 connected between an output of the inverter I1 and the ground voltage VSS receives the second enabling signal ENALBLEB.

The selecting signal generator 220 includes two NOR gates NOR2 and NOR3 and two inverters I6 and I7. The first NOR gate NOR2 receives a supply voltage selecting signal BD33 and the self refresh signal SREF. The supply voltage selecting signal BD33 indicates the level of the input supply voltage. For example, the supply voltage selecting signal BD33 has information about what level the supply voltage has among the supply voltages having a 3.3V or a 1.8V level. The first inverter I6 inverts an output of the NOR gate NOR2. The NOR gate NOR3 receives the detecting signal DET and an output of the first inverter I6. The second inverter I7 inverts an output of the second NOR gate NOR3 to generate the detecting signal DET.

Figure 6:
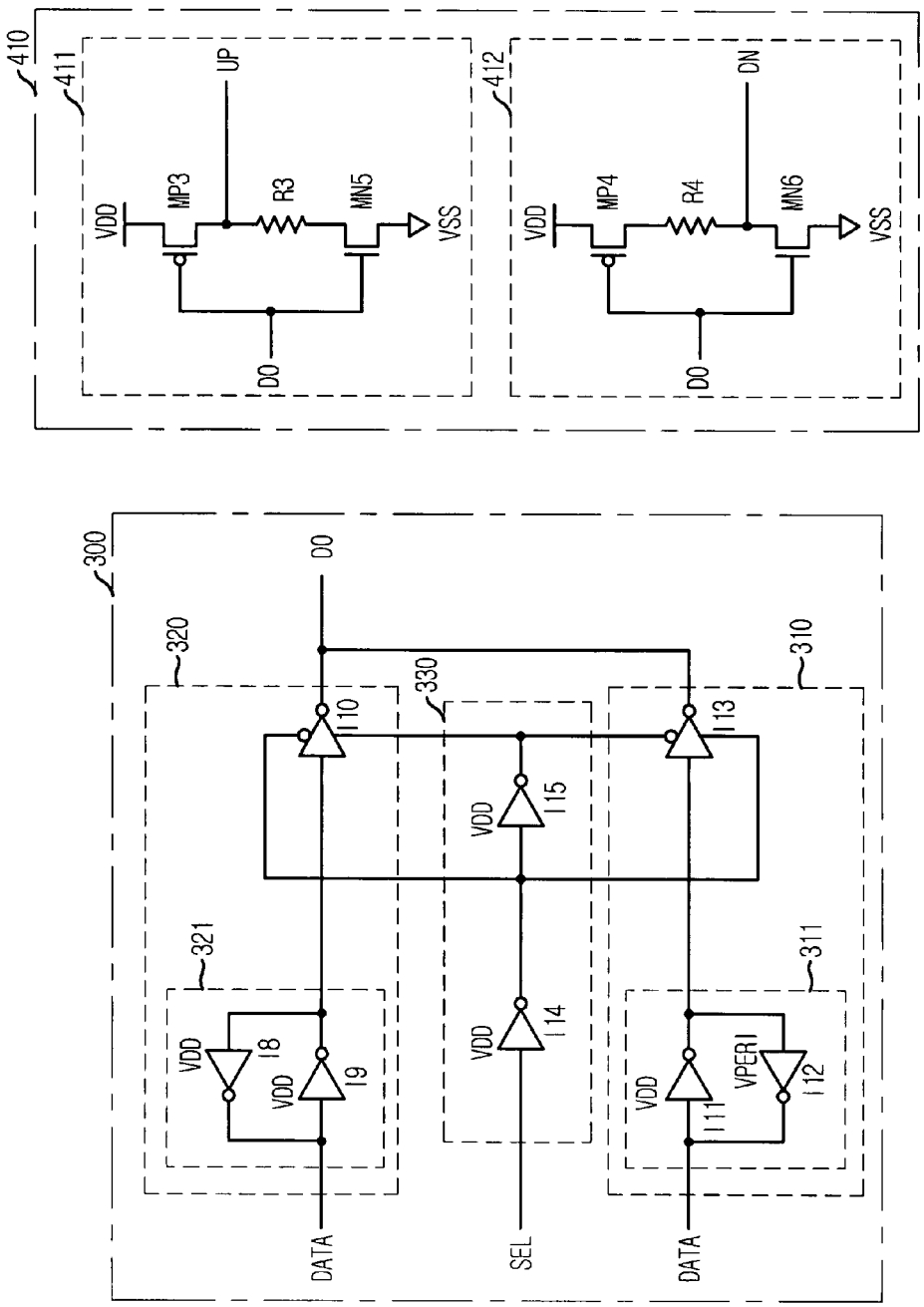
FIG. 6 is a schematic circuit diagram of a data transmitter and a pre driver shown in FIG. 3.

FIG. 6 is a schematic circuit diagram of the data transmitter and the pre driver shown in FIG. 3. The data transmitter 300 includes a first transmitting circuit 310, a second transmitting circuit 320, and a selecting controller 330. The pre driver 410 includes a first pre driver 411 and a second pre driver 412.

The first transmitting circuit 310 transmits the data DATA by using the internal power voltage VPERI. The first transmitting circuit 310 includes two inverters I11 and I12 and a 3 state inverter I13. The two inverters I11 and I12, receiving the internal power voltage VPERI and the ground voltage VSS, constitute a latch 311 for latching the data DATA. The 3-state inverter I13, controlled by the selecting signal SEL, inverts the data output by the latch 311 to thereby transmit the transmitting data to the output driver 400.

The second transmitting circuit 320 transmits the data DATA by using the supply voltage VDD. The second transmitting circuit 320 includes two inverters I8 and I9 and a 3 state inverter I10. The two inverters I8 and I9, receiving the supply voltage VDD and the ground voltage VSS, constitute a latch 321 for latching the data DATA. The 3-state inverter I10, controlled by the selecting signal SEL, inverts the data output by the latch 321 to thereby transmit the transmitting data to the output driver 400.

The selecting controller 330 determines which one, among the first and second transmitting circuits 310 and 320, is connected to the output driver 400 according to the selecting signal SEL. The selecting controller 330 activates the first transmitting circuit 310 in response to the selecting signal SEL during a normal mode, in order to transmit the data output from the first transmitting circuit 310 to the output driver 400. The selecting controller 330 also controls the second transmitting circuit 320 connected to the output driver 400. The selecting controller 330 includes two inverters I14 and I15. The first inverter I14 inverts the selecting signal SEL, outputting an inverted signal to control the first transmitting circuit 310. The second inverter I15 inverts an output of the first inverter I14 to control the second transmitting circuit 320.

The first pre driver 411 transmits a high level of transmitting data DO from the data transmitter 300 to the main driver 420. The first pre driver 411 includes a PMOS transistor MP3, an NMOS transistor MN5, and a resistor R3. The PMOS transistor MP3, connected between the supply voltage VDD and the resistor R3, receives the transmitting data DO through its gate. The NMOS transistor MN5, connected between the ground voltage VSS and the resistor R3, receives the transmitting data DO through its gate.

The second pre driver 412 transmits a low level of transmitting data DO from the data transmitter 300 to the main driver 420. The second pre driver 412 includes a PMOS transistor MP4, an NMOS transistor MN6, and a resistor R4. The PMOS transistor MP4, connected between the supply voltage VDD and the resistor R4, receives the transmitting data DO through its gate. The NMOS transistor MN6, connected between the ground voltage VSS and the resistor R4, receives the transmitting data DO through its gate.

Referring to FIGS. 5 and 6, an operation of the semiconductor memory device in accordance with the present invention is described. The voltage sensor 210 outputs the detecting signal DET at a low logic state when the internal power voltage VPERI is at a predetermined level for the normal operation. The voltage sensor 210 outputs the detecting signal DET at a high logic state when the internal power voltage VPERI is at a lower level than the predetermined level.

The enabling signal generator 212 enables the comparator 213 by outputting the enabling signals ENABLE and ENABLEB in response to the self refresh signal SREF. The comparing voltage generator 211 divides the internal power voltage VPERI and generates the comparing voltage VR. The comparator 213 compares the comparing voltage VR with the reference voltage VREF. When the comparing voltage VR is higher than the reference voltage VREF, the comparator 213 outputs a low level for the detecting signal DET. Otherwise, when the comparing voltage VR is lower than the reference voltage VREF, the comparator 213 outputs a high level for the detecting signal DET. That is, the high level for detecting signal DET means that the internal power voltage VPERI is at a lower level than the predetermined level. The low level for detecting signal DET means that the internal power voltage VPERI is at the predetermined level.

The selecting signal generator 220, activated by the self refresh signal SREF or the supply voltage selecting signal BD33, outputs a high level for the selecting signal SEL when the detecting signal DET is input in a high level. A high level for the self refresh signal SREF represents that the self refresh operation is being performed. The high level for the supply voltage selecting signal BD33 represents that a 3.3V of supply voltage is input. When the supply voltage is input at 3.3V, the selecting signal SEL is in the high logic state. When the supply voltage is input at 1.8V, the selecting signal SEL is in the high logic state during the self refresh operation, because the self refresh signal SREF is at a high logic level during the self refresh operation. After the self refresh operation is terminated, the self refresh signal SREF becomes a low logic state and the detecting signal DET determines the level of the selecting signal SEL. When the level of the internal power voltage is lower than the predetermined level, i.e., the supply voltage level, the detecting signal DET becomes a high logic state. The selecting signal SEL also becomes a high logic state. After the internal power voltage VPERI reaches the predetermined level, the detecting signal becomes a low logic state, and the selecting signal SEL becomes a low state. Even if the self refresh operation is finished, the selecting signal SEL becomes a low logic state until the internal power voltage VPERI recovers up to the predetermined level.

The data transmitter 300 transmits data through two routes. The inverters I11 to I13 of the first data transmitting circuit 310 on the first route are operated with the internal power voltage VPERI. The inverters I8 to I10 of the second data transmitting circuit 320 on the second route are operated with the supply voltage VDD.

When the supply voltage is input to 3.3V, the selecting signal SEL maintains a high logic level. An output of the second data transmitting circuit 320 is transmitted to the pre driver 410.

When the supply voltage is input to 1.8V, an output of the first data transmitting circuit 310 is transmitted to the pre driver 410 in the normal mode. In the self refresh operation, the level of the internal power voltage VPERI provided to the first transmitting circuit 310 is changed from the level of the supply voltage to that of the core voltage, in order to reduce the power consumption. At that level, an output of the inverter I13 cannot turn off the transistors in the pre driver 410, and it is possible to cause the leakage current. Accordingly, the selecting signal SEL has a high logic level in the self refresh operation, and an output of the inverter I10 is transmitted to the pre driver 410.

After a self refresh operation is ended, the level of the internal power voltage VPERI does not immediately recover from the level of the core voltage to that of the original voltage during a predetermined period. However, the selecting signal SEL maintains a high logic level in the predetermined period because the selecting signal SEL is controlled by the detecting signal DET. That is, the selecting signal SEL is controlled by the self refresh signal SREF in the self refresh operation, and is also controlled by the detecting signal DET at the end of the self refresh operation. Accordingly, in the predetermined period after the self refresh operation has ended until the internal power voltage VPERI recovers to the original level, referring to the point X in FIG. 4, an output of the second data transmitting circuit 320, which uses the supply voltage VDD, is transmitted to the pre driver 410. A leakage current is prevented.

With the above embodiment of the present invention, it is possible to support a semiconductor memory device using plural voltage levels. In addition, even if a plurality of data transmitting circuits are provided in the present invention, circuits temporally connected to the pre driver can be used separately.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
a voltage generator configured to generate an internal power voltage, which is lower during a power saving mode than during a normal mode, for a peripheral area;
a sensing controller configured to generate a control signal corresponding to a level of the internal power voltage;
an output driver configured to drive a transmitting data by using an output voltage; and
a data transmitter configured to convert an inputting data into the transmitting data by using the internal power voltage or convert the inputting data into the transmitting data by using the output voltage in response to the control signal.

2. The semiconductor memory device of claim 1, wherein the power saving mode includes a refresh operation.

3. The semiconductor memory device of claim 2, wherein the refresh operation includes one of an auto refresh operation and a self refresh operation.

4. The semiconductor memory device of claim 1, wherein the level of the output voltage is the level of a supply voltage input from an external device.

5. The semiconductor memory device of claim 1, wherein the level of the internal power voltage in a power saving mode is the level of a core voltage.

6. The semiconductor memory device of claim 1, wherein the voltage generator includes:
a first voltage generator for outputting the internal power voltage at a predetermined level; and
a second voltage generator for outputting the internal power voltage at a lower level than the predetermined level.

7. The semiconductor memory device of claim 1, wherein the sensing controller includes:
a voltage sensor for sensing the level of the internal power voltage output from the voltage generator in the power saving mode;
a control signal generator, enabled by a power saving signal activated in the power saving mode, for outputting a control signal to the data transmitter according to sensing results of the voltage sensor.

8. The semiconductor memory device of claim 1, wherein the output driver includes:
a pre driver for buffering the transmitting data by using the output voltage; and
a main driver for driving buffered data through a data I/O pad.

9. The semiconductor memory device of claim 7, wherein the voltage sensor includes:
an enabling signal generator for outputting enabling signals in response to the power saving signal;
a comparing voltage generator for outputting a comparing voltage in the range from a ground voltage to the internal power voltage; and
a comparator for comparing the comparing voltage and a reference voltage and outputting a detecting signal.

10. The semiconductor memory device of claim 9, wherein the enabling signal generator includes:
a plurality of inverters in series for delaying the power saving signal;
a first NOR gate for receiving an output of the plurality of inverters and the power saving signal;
a first inverter for inverting an output of the first NOR gate and outputting a first enabling signal; and
a second inverter for inverting an output of the first inverter and outputting a second enabling signal.

11. The semiconductor memory device of claim 10, wherein the comparing voltage generator includes two resistors in series between the internal power voltage and the ground voltage.

12. The semiconductor memory device of claim 10, wherein the comparator includes:
first and second PMOS transistors coupled to the supply voltage for constituting a current mirror;
a first NMOS transistor coupled to the first PMOS transistor for receiving the comparing voltage through a gate;
a second NMOS transistor coupled to the second PMOS transistor for receiving the reference voltage through a gate;
a third NMOS transistor coupled to the first and the second NMOS transistors for receiving a bias voltage through a gate;
a fourth NMOS transistor connected between the third NMOS transistor and the ground voltage for receiving the first enabling signal through a gate;
a third inverter coupled to the second NMOS transistor for outputting the detecting signal; and
a fifth NMOS transistor connected between an output of the third inverter and the ground voltage for receiving the second enabling signal through a gate.

13. The semiconductor memory device of claim 1, wherein the data transmitter includes:
a first transmitting circuit for transmitting the inputting data by using the internal power voltage;
a second transmitting circuit for transmitting the inputting data by using the output voltage;
a selecting controller for activating the first transmitting circuit in the normal mode or activating the second transmitting circuit in the power saving mode in response to the control signal.

14. The semiconductor memory device of claim 13, wherein the first transmitting circuit includes:
first and second inverters for receiving the internal power voltage and the ground voltage and constituting a first latch for latching the inputting data; and
a first 3-state inverter turned on by a first selecting signal for inverting data output by the first latch and transmitting inverted data to the output driver.

15. The semiconductor memory device of claim 14, wherein the second transmitting circuit includes:
third and fourth inverters for receiving the output voltage and the ground voltage and constituting a second latch for latching the inputting data; and
a second 3-state inverter turned on by a second selecting signal for inverting data output by the second latch and transmitting inverted data to the output driver.

16. The semiconductor memory device of claim 15, wherein the selecting controller includes:
a fifth inverter for receiving and inverting the control signal and outputting the first selecting signal to the first transmitting circuit; and
a sixth inverter for receiving and inverting an output of the first inverter and outputting the second selecting signal to the second transmitting circuit.

17. The semiconductor memory device of claim 8, wherein the pre driver includes:
a first pre driver for transmitting the high level of transmitting data to the main driver by using the output voltage; and
a second pre driver for transmitting the low level of transmitting data to the main driver by using the output voltage.

18. The semiconductor memory device of claim 17, wherein the first pre driver includes:
a first PMOS transistor coupled to the output voltage for receiving the transmitting data through a gate;
a first NMOS transistor coupled to the ground voltage for receiving the transmitting data through a gate; and
a first resistor connected between the first PMOS and the first NMOS transistors.

19. The semiconductor memory device of claim 18, wherein the second pre driver includes:

a second PMOS transistor coupled to the output voltage for receiving the transmitting data through a gate;
a second NMOS transistor coupled to the ground voltage for receiving the transmitting data through a gate; and
a second resistor connected between the second PMOS and the second NMOS transistors.

20. A semiconductor memory device, comprising:
a voltage generator for outputting an internal power voltage for a peripheral area at a first voltage level during a normal operation and at a second voltage level, lower than the first voltage level, during a refresh operation;
a voltage sensor for sensing the level of the internal power voltage;
a selecting signal generator for outputting a selecting signal according to sensing results of the voltage sensor;
a data transmitter for converting an inputting data into an transmitting data by using the internal power voltage or an output voltage in response to the selecting signal; and
an output driver for driving the transmitting data by the output voltage,
wherein the output voltage is in the first voltage level.

21. The semiconductor memory device of claim 20, wherein the refresh operation includes one of an auto refresh operation and a self refresh operation.

22. The semiconductor memory device of claim 20, wherein the level of the output voltage is the level of a supply voltage input from an external device.

23. The semiconductor memory device of claim 20, wherein the second voltage level is the level of a core voltage.

24. The semiconductor memory device of claim 20, wherein the voltage generator includes:
a first voltage generator for outputting the internal power voltage at the first voltage level; and
a second voltage generator for outputting the internal power voltage at the second voltage level.

25. The semiconductor memory device of claim 20, wherein the output driver includes:
a pre driver for buffering the transmitting data by using the output voltage; and
a main driver for driving buffered data through a data I/O pad.

26. The semiconductor memory device of claim 20, wherein the voltage sensor includes:
an enabling signal generator for outputting enabling signals in response to a refresh signal activated in the refresh operation;
a comparing voltage generator for outputting a comparing voltage in the range from a ground voltage to the internal power voltage as the first voltage level; and
a comparator for comparing the comparing voltage and a reference voltage and outputting a detecting signal.

27. A semiconductor memory device for receiving one of a first supply voltage and a second supply voltage, higher than the first supply voltage, comprising:
a voltage generator for outputting an internal power voltage for a peripheral area at a first voltage level in a normal operation and at a second voltage level, lower than the first voltage level, in a power saving mode by using the supply voltage;
a sensing controller for outputting a control signal corresponding to the level of the internal power voltage;
a first data transmitter for transmitting inputting data by using the internal power voltage at the first supply voltage;
a second data transmitter for transmitting the inputting data by using the supply voltage at the second supply voltage;
a selecting controller for selectively enabling one of the first and the second data transmitters according to the control signal; and
an output driver for driving data transmitted from the data transmitters by using the supply voltage.

28. The semiconductor memory device of claim 27, wherein the power saving mode includes a refresh operation.

29. The semiconductor memory device of claim 28, wherein the refresh operation includes one of an auto refresh operation and a self refresh operation.

30. The semiconductor memory device of claim 27, wherein the second voltage level is the level of a core voltage.

31. The semiconductor memory device of claim 27, wherein the voltage generator includes:
a first voltage generator for outputting the internal power voltage at the first voltage level; and
a second voltage generator for outputting the internal power voltage at the second voltage level.

32. The semiconductor memory device of claim 27, wherein the sensing controller includes:
a voltage sensor for sensing the level of the internal power voltage output from the voltage generator in the power saving mode;
a selecting signal generator enabled by a power saving signal activated in the power saving mode for outputting a control signal to the data transmitters according to sensing results of the voltage sensor.

33. The semiconductor memory device of claim 27, wherein the output driver includes:
a pre driver for buffering the data output from the first and the second data transmitters by using the supply voltage; and
a main driver for driving buffered data through a data I/O pad.

34. The semiconductor memory device of claim 32, wherein the voltage sensor includes:
an enabling signal generator for outputting enabling signals in response to the power saving signal;
a comparing voltage generator for outputting a comparing voltage in the range from a ground voltage to the internal power voltage as the first voltage level; and
a comparator for comparing the comparing voltage and a reference voltage and outputting a detecting signal.

35. A method for driving a semiconductor memory device, comprising:
generating an internal power voltage for a peripheral area at a first voltage level;
decreasing the internal power voltage from the first voltage level to a second voltage level in a power saving mode;
sensing the level of the internal power voltage;
outputting a control signal in response to the sensing results;
latching data output from a core area by using the first voltage level of the internal power voltage or the second voltage level of the internal power voltage in response to the control signal; and
driving an output driver in response to the latched data.

36. The method for driving the semiconductor memory device of claim 35, wherein the power saving mode includes a refresh operation.

* * * * *